United States Patent
Teng et al.

(10) Patent No.: US 6,751,786 B2
(45) Date of Patent: Jun. 15, 2004

(54) CLOCK TREE SYNTHESIS FOR A HIERARCHICALLY PARTITIONED IC LAYOUT

(75) Inventors: Chin-Chi Teng, Sunnyvale, CA (US); Wei-Jin Dai, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 15 days.

(21) Appl. No.: 10/043,458

(22) Filed: Jan. 9, 2002

(65) Prior Publication Data

US 2003/0208736 A1 Nov. 6, 2003

(51) Int. Cl.[7] .............................................. G06F 17/50
(52) U.S. Cl. .................................. 716/18; 716/6; 716/7
(58) Field of Search ............................. 716/2, 6, 7, 18

(56) References Cited

U.S. PATENT DOCUMENTS

| | | | | |
|---|---|---|---|---|
| 5,077,676 A | * | 12/1991 | Johnson et al. ................. | 716/6 |
| 6,053,950 A | * | 4/2000 | Shinagawa ...................... | 716/2 |
| 6,305,001 B1 | * | 10/2001 | Graef ............................ | 716/12 |
| 6,327,692 B1 | * | 12/2001 | Brown ........................... | 716/1 |
| 6,351,840 B1 | * | 2/2002 | Teng .............................. | 716/7 |
| 6,536,024 B1 | * | 3/2003 | Hathaway ....................... | 716/6 |

OTHER PUBLICATIONS

Minami, F. et al., "Clock tree synthyesis based on RC delay balancing", 1992, IEEE, pp. 28.3.1–28.3.4.*
Luis, J. et al., "Circuit synthyesis of clock distribution networks based on non–zero clock skew", 1994, IEEE, pp. 175–178.*
Krishnamurthy, H. et al., "A new partitioning framework for uniform clock distribution during high level synthyesis", 1998, IEEE, pp. 381–384.*

* cited by examiner

Primary Examiner—Stacy A. Whitmore
(74) Attorney, Agent, or Firm—Daniel J. Bedell; Smith-Hill and Bedell (57) ABSTRACT

A method is disclosed for synthesizing a clock tree for a partitioned integrated circuit (IC) layout comprising a plurality of base level partitions and a top level partition each occupying a separate area of a semiconductor substrate. The base level partitions include syncs to be clocked by edges of a clock signal applied to an entry node within the area occupied by the top level partition. In accordance with the method, a plurality of independently balanced subtrees are separately synthesized. Each subtree resides within the area occupied by a separate base level partition and includes a start point at a perimeter of the area occupied by that base level partition and a network of buffers and signal paths for conveying a clock signal edge from the start point to each sync included within that area. Thereafter a top level portion of the clock tree is synthesized. The top level portion of the subtree resides within the substrate area containing the top level partition and conveys the clock signal from the entry point to the start point of each synthesized subtree.

15 Claims, 5 Drawing Sheets

CLOCK TREE SYNTHESIS FOR A HIERARCHICALLY PARTITIONED IC LAYOUT

BACKGROUND OF THE INVENTION

1. Field of the Invention

The present invention relates in general to computer-aided design tools for generating hierarchical integrated circuit (IC) layouts, and in particular to a method for synthesizing a clock tree for a hierarchically partitioned IC layout.

2. Description of Related Art

Hierarchical IC Layouts

A "cell library" is a data base of models of various circuit components ("cells") an integrated circuit (IC) designer can incorporate into an IC design. The cell library includes behavioral models of each cell and also a physical model of each cell showing placement and routing (P&R) tools how the cell is to be laid out in an a semiconductor substrate when included in an IC.

An IC designer typically creates a "netlist" describing the IC by referencing the library cells forming it and indicating how the terminals of the cells are logically interconnected. After having created the netlist, and having used a circuit simulator and other tools to the verify the behavior of the circuit described by the netlist, an IC designer typically provides the netlist as input to an automated P&R tool which designs the physical layout of the IC on a semiconductor substrate. The P&R tool consults the cell library to determine how to lay out each cell described by the netlist and then determines where to place each cell in the substrate and how to form signal, power and ground paths for connecting the cells to one another.

Figure 1:
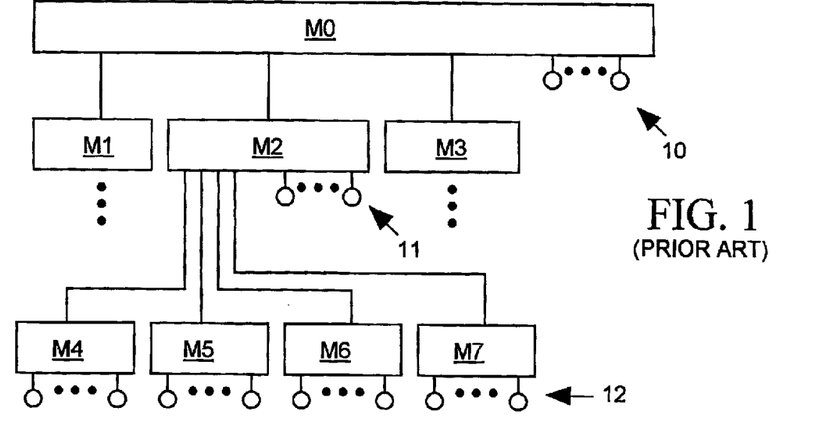
FIG. 1 is a block diagram illustrating a prior art hierarchical integrated circuit (IC) design.

The netlist that the designer produces usually describes an IC as a hierarchy of modules. For example as illustrated in FIG. 1, the netlist may consider an entire IC design to be a single top level (level 1) module M0. A set of three level 2 modules M1–M3 and some individual cells 10 not included in any of modules M1–M3 form module M0. Each module M1–M3 may in turn be formed by level 3 modules or cells. In the example of FIG. 1, module M2 includes a set of four level 3 modules M4–M7 and some individual cells 11 not included in any of modules M4–M7. Modules M4–M7 reside at the lowest level (level 3) of the modular hierarchy because they are formed only by base level cells 12 which are not organized into submodules. Although FIG. 1 illustrates a circuit design having only a few modules organized into a three hierarchical levels, a large IC design may include hundreds or thousands of modules organized into many more hierarchical levels.

An IC designer organizes a IC design as a hierarchy of modules to make it easier to conceptualize the IC. However since a typical P&R tool is interested only in finding a suitable position for each cell of the design, it ignores the modularity of the design and places each cell wherever it is convenient to do so and does not try to keep all of the cells of a given module within a separately identifiable area of a semiconductor substrate. Hence the cells forming various modules of a hierarchical design usually end up being intermingled to some extent in an IC layout.

Partitioned Layouts

Figure 2:
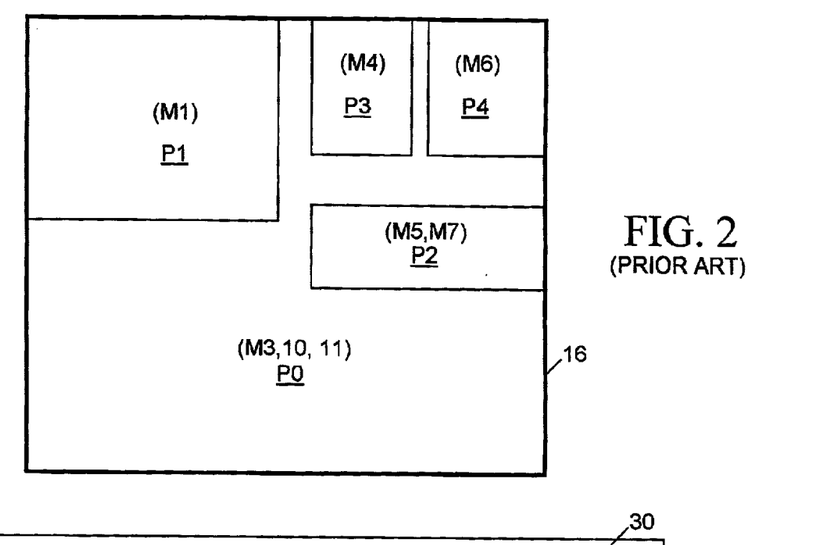
FIG. 2 is a prior art floor plan for the layout of the IC design of FIG. 1.

A designer may want to produce a "partitioned" IC layout in which one or more selected modules are to be placed in separate partitions of a substrate. For example FIG. 2 illustrates a floor plan for a semiconductor substrate 16 upon which the IC of FIG. 1 may be formed. FIG. 1 illustrates how the IC layout of FIG. 1 might be partitioned. In this example, module M1 is placed within partition P1, modules M5 and M7 are placed within partition P2, modules M4 and M6 are placed in partitions P3 and P4, respectively. All modules and cells not included in any "base level" partition P1–P4 (in this example only module M3 and cells 10 and 11 of modules M0 and M2_) may be placed anywhere within a "top level" partition P0. For simplicity partitions P0–P4 are illustrated as being rectangular, but partitions may be of more complicated shapes. Given a pin assignment plan indicating the places along the boundaries of the various partition where signal paths are to cross between partitions, P&R tools can independently lay out each partition, provided that they are able to keep the layouts within the partition boundaries specified by the floor plan.

It can be advantageous to partition a design because a P&R tool can often separately layout several partitions of a design faster than it can lay out an unpartitioned design. Also when a designer places a selected module of a design in an identifiable area of a substrate so that its cells are not intermingled with cells of other modules, the designer may be able to later modify that particular module without greatly affecting the layout of other modules. However, as discussed below, problems associated with clock tree synthesis tend to increase the interdependence of partition layouts, thereby complicating the layout process after one partition is changed.

Clock Tree Synthesis

Figure 3:
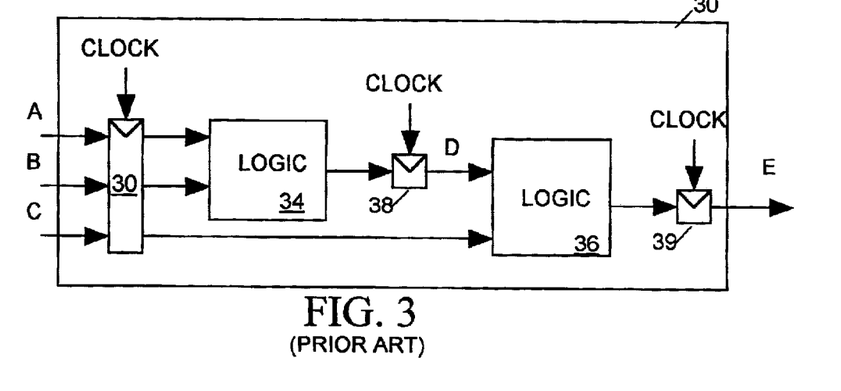
FIG. 3 is a block diagram illustrating a prior art synchronous circuit.

Digital ICs typically implement synchronous logic circuits that are clocked by externally generated clock signals. For example FIG. 3 shows a simple example of a synchronous logic circuit within an IC 30. A latch 30 latches two IC input signals A and B onto inputs of a logic circuit 34 and an IC input signal C onto an input of a logic circuit 36. Logic circuit 34 carries out logic operations on signals A and B to produce an output signal D latched onto another input of logic circuit 36 by a latch 38. Logic circuit 36 processes signals C and D to form a signal E, and a latch 39 latches signal E onto an output terminal of IC 30. A CLOCK signal supplied as input to IC 30 clocks all of latches 30, 38 and 39. For the circuit to operate synchronously, it is necessary to route the CLOCK signal to each latch 36, 38 and 39 in such a way that edges of the CLOCK signal arrive substantially at the same time at all latches.

While FIG. 3 shows only three devices being clocked by the CLOCK signal, a typical IC can have hundreds or thousands of clocked devices ("syncs") such as latches, registers and flip-flops. After a P&R tool has generated an IC layout in which all of the cells (including all of the syncs) have been placed and routed, a "clock tree synthesis" tool designs a clock tree for routing CLOCK edges from the IC's clock input terminal concurrently to all syncs.

Figure 4:
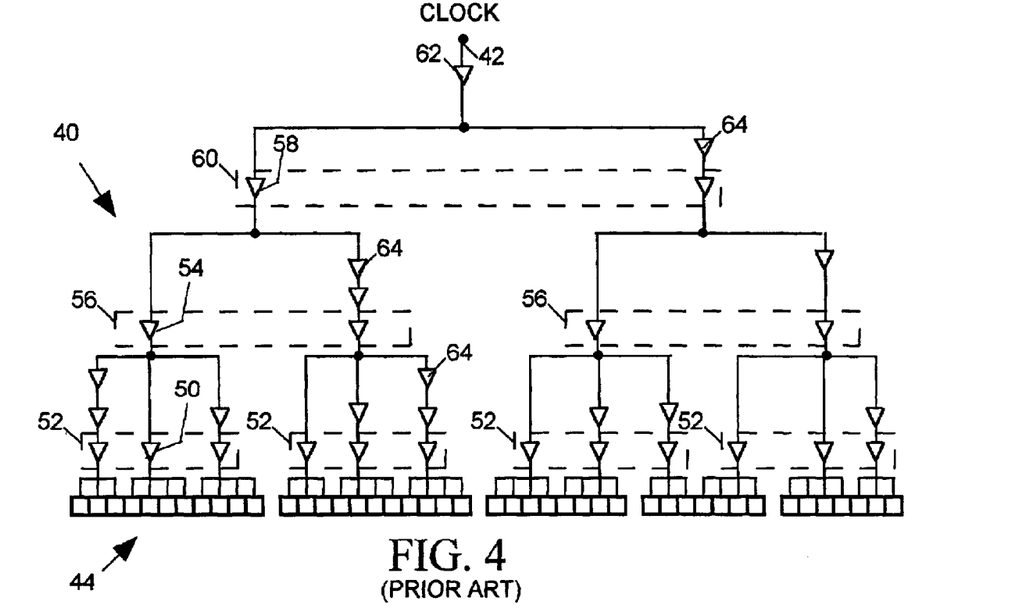
FIG. 4 is schematic diagram of a prior art integrated circuit clock tree.
Figure 5:
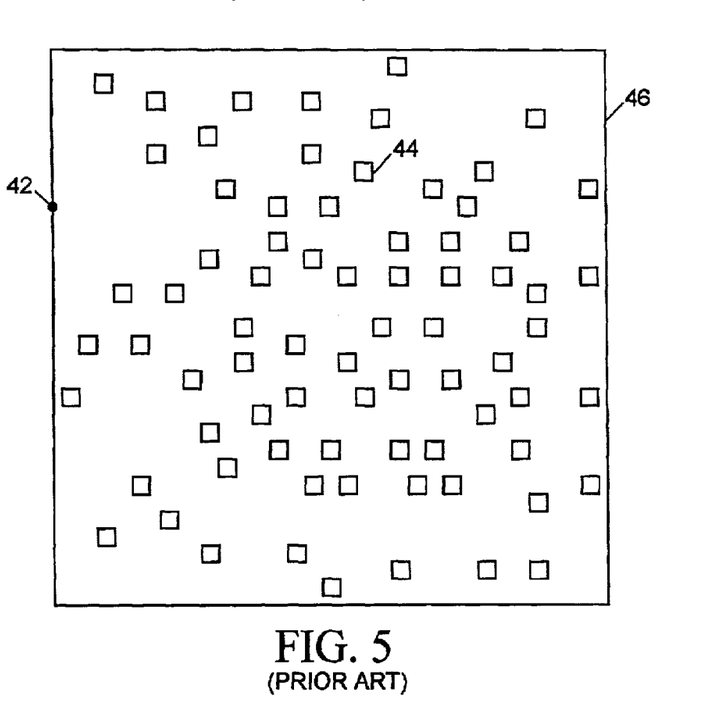
FIG. 5 is a simplified plan view of a semiconductor substrate showing positions the syncs of FIG. 4 occupy within an IC layout.
Figure 6:
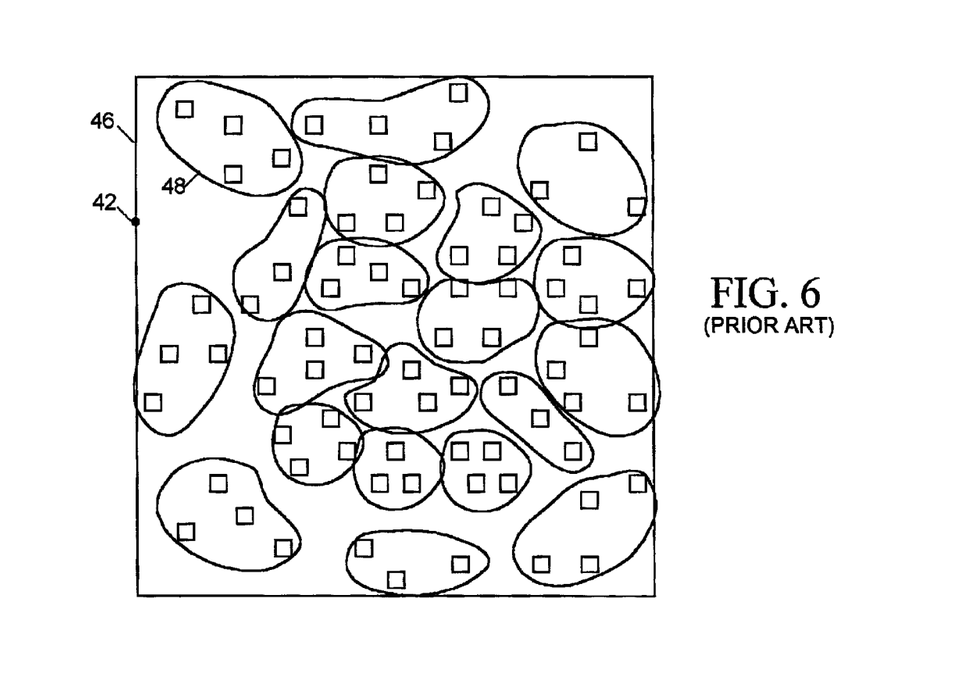
FIG. 6 illustrates a manner in which a prior art clock tree synthesis tool might organize the syncs of FIG. 5 into clusters.

FIG. 4 is a schematic diagram illustrating a clock tree 40 for delivering a CLOCK signal from an IC input pin 42 to several syncs 44. FIG. 5 illustrates positions of syncs 44 within an IC substrate 46 after a P&R tool has generated a full-chip IC layout. A typical clock tree synthesis tool begins designing the clock tree of FIG. 4 by assigning each sync 44 into one of a set of "clusters" 48 as illustrated in FIG. 6. The clock tree will deliver the CLOCK signal to the syncs 44 of each cluster 48 through a separate one of signal buffers 50 (FIG. 4), and therefore each cluster 48 will include no more than the maximum number of syncs 44 a single buffer 50 can drive. To ensure that CLOCK signal edges travel from the output of each buffer 50 to all syncs 44 it drives with as nearly as possible the same delay, the clock tree synthesis tool groups only nearby syncs 44 into the same cluster 48.

This ensures that the CLOCK signal path distance from each buffer 50 to the syncs it drives will be substantially similar regardless of where the buffer is placed.

Having grouped all syncs 44 into clusters and having specified an approximate location for each buffer 50 near the cluster it drives, the synthesis tool next groups nearby buffers 50 into clusters. As illustrated in FIG. 4, the CTS tool has grouped twelve buffers 50 into four clusters 52. The CTS tool then provides a separate buffer 54 to drive each cluster 52 of buffers 50. After specifying an approximate location for each second level buffer 54 near the cluster of first level buffers 50 it is to drive, the CTS tool groups buffers 54 into clusters 56, each driven by a separate buffer 58. All buffers 58 are then grouped into a single cluster 60 to be driven by a single buffer 62. The result is a hierarchical clock tree 40 having four levels of buffers 50, 54, 58 and 62.

Having laid out the basic framework of clock tree 40, the CTS tool next must "balance" the clock tree to ensure that each CLOCK signal edge arrives at all syncs 44 at as nearly as possible the same time, thereby substantially zeroing the CLOCK signal skew between syncs 44. To do so the CTS tool may insert additional buffers 64 into various branches of tree 40, since adding a buffer 64 to a branch reduces the signal path delay through that branch. The CTS tool may also adjust the size of selected buffers in each clock signal path; large buffers switch faster than small buffers and therefore propagate CLOCK signal edges faster. A CTS tool may also make fine adjustments to path delays by adjusting the positions of the buffers along a path. By adjusting the number, size and positions of buffers within each branch of clock tree 40, a "zero skew" CTS tool can synchronize the arrival of CLOCK signal edges at a large number of syncs with a high degree of accuracy.

Figure 7:
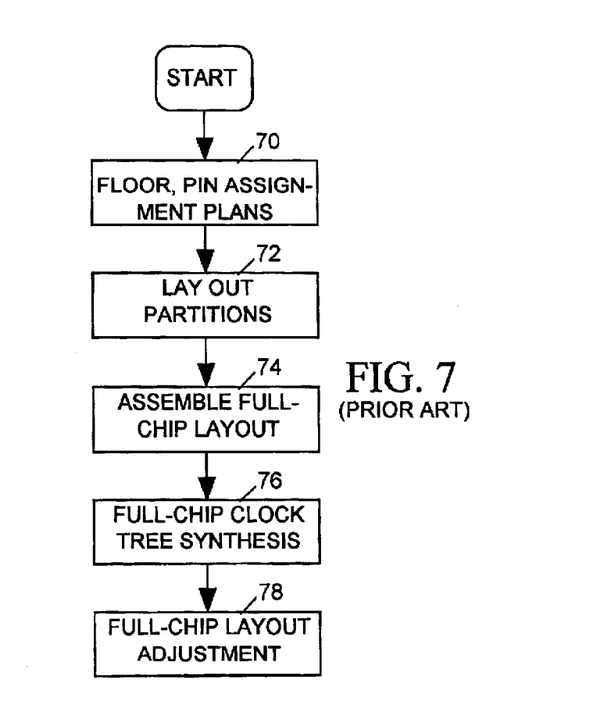
FIG. 7 is a flow chart illustrating a prior art IC layout and clock tree synthesis process.

FIG. 7 illustrates the steps in a conventional process for producing an IC layout when a design has been partitioned. The first step (step 70) is to create a floor plan reserving a separate area of the substrate for each partition P0–P4 of the design and a pin assignment plan indicating points at which signal are to cross boundaries of each partition. P&R tools then separately lay out each partition P0–P4 (step 72). After the partition layouts are combined to form a full-chip layout (step 74), a CTS tool synthesizes a clock tree for the entire IC (step 76). As it synthesizes a clock tree, the CTS tool establishes only an approximate position for each buffer forming the clock tree and only approximates the routing of signal paths that will link the buffers to one another and to the syncs so that it can make reasonably accurate estimates of signal path delays through the clock tree. After the CTS tool has established approximate positions of clock tree buffers and signal paths, the P&R tool must globally adjust the layout of the entire IC to position each buffer forming the clock tree and to detail the routing of the signal paths that interconnect the buffers and syncs (step 78). In doing so, the P&R tool may move some of the cells forming the IC to make room for the clock tree buffers and clock tree signal routing paths. Thus even though a P&R tool may be able to separately lay out each partition of a design and then assemble the partitions into a full-chip layout, it must reprocess the entire full-chip layout at step 78, including the layout of each partition, following clock tree synthesis in order to place and route the buffers and signal paths forming the clock tree.

Conventional CTS tools operate only after the partitions have been merged because they must have a global view of clock signal path delays throughout the entire IC in order to balance the clock tree. Therefore, should the designer make a change to any partition of an IC design after the layout process is complete, it necessary for the designer to adjust not only the layout of that partition, but to also adjust the layout of every other partition of the design to accommodate global changes that a CTS tool might make in a clock tree when any small part of a layout changes. Thus while IC designs can initially be divided into partitions that can be separately laid out, any subsequent change to any partition that affects a clock tree can make it necessary to adjust the layout of every other partition.

What is needed is a clock tree synthesis system that can partition the design of a clock tree along the same lines that an IC is partitioned for layout purposes so that a change to the layout of any one partition requiring a change in the portion of the clock tree residing within that partition would not affect portions of the clock tree residing within any other partition and would therefore not require a change to the layout of any other partition.

SUMMARY OF THE INVENTION

The invention relates to a method and apparatus for synthesizing a clock tree for a partitioned integrated circuit (IC) layout, wherein the layout includes a plurality of base level partitions and a top level partition, with each partition occupying a separate area of a semiconductor substrate. Each base level partition includes several syncs to be clocked by edges of a clock signal applied to an entry node within the area occupied by the top level partition.

In accordance with the invention, a subtree is separately synthesized for each base level partition. The subtree for each base level partition includes a start point at a perimeter of the area occupied by that partition and a network of buffers and signal paths for conveying a clock signal edge from the start point to each sync included within that area. The subtree for each base level partition is balanced so that it delivers each clock signal edge arriving at its start point to each sync within the base level partition with a substantially similar delay. However the subtrees for the separate base level partitions are separately and independently balanced and will normally have substantially differing average clock signal path delays between their start points and the syncs they clock.

After the clock tree for each base level partition is synthesized, a top level portion of the clock tree is synthesized. The top level portion of the subtree resides within the substrate area containing the top level partition and conveys the clock signal from the IC clock signal entry point to the start point of each synthesized subtree. Clock signal paths within the top level portion of the subtree are adjusted to compensate for differences in the average path delays of the subtrees so that the clock tree conveys each clock signal edge arriving at the IC entry point to every sync with substantially the same delay.

Once the clock tree has been synthesized, it is possible to re-synthesize the top level portion of the clock tree and the subtree for any one base level partition to accommodate a change in the layout of that one base level partition. It is not necessary to modify the subtree for any other base level partition.

Accordingly it is an object of the invention to provide a system for synthesizing a clock tree for a partitioned IC design, wherein changes in the layout of any base level partition do not necessitate changes to portions of the clock tree serving syncs residing in any other base level partition.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DESCRIPTION OF THE PREFERRED EMBODIMENT(S)

The present invention is directed to a method and apparatus for synthesizing a clock tree for an IC design that has been divided into partitions for separate placement and routing. The invention is suitably implemented in the form of a computer program stored on computer-readable media such as, for example, a compact disk so that the program may be read and executed by a conventional computer. This specification describes an exemplary embodiment and application of the invention considered by the applicants to be the best mode of practicing the invention.

An IC designer typically creates a netlist describing an IC as a hierarchy of modules. For example as illustrated in FIG. 1, the netlist may consider an entire IC design to be a single top level module M0 formed by a set of three lower level modules M1–M3 along with some individual cells 10 not included in any of modules M1–M3. Each module M1–M3 is in turn formed by lower level modules and cells. For example module M2 is formed by a set of four lower level modules M4–M7 and some individual cells 12 not included in any of modules M4–M7. In this example modules M4–M7 reside at the lowest level of the modular hierarchy because they are formed only by base level cells 14 which are not organized into submodules. Although FIG. 1 illustrates a circuit design having only a few modules organized into a few hierarchical levels, a large IC design may include a large number of modules organized into many hierarchical levels.

A designer sometimes divides an IC design into partitions so that a placement and routing (P&R) tool can separately lay out each partition. For example FIG. 2 illustrates a floor plan a designer might create when partitioning the hierarchical circuit of FIG. 1. Here the designer has specified that various modules are to be placed in particular rectangular partitions of an IC substrate 16. All cells forming modules M1, M4, and M6 are to be placed within partitions P1, P3, and P4, respectively. All cells forming modules M5 and M7 are to be placed within partition P2, though cells of the two modules may be intermingled with one another within that partition. All other modules and cells not assigned to any of the "base level" partitions may be placed anywhere within a "top level" partition P0 which includes all areas of substrate 16 not reserved for the base level partitions P1–P4. Thus module M3 and the individual cells 10 and 11 of modules M0 and M2 not included in any base level partition may be placed anywhere within top level partition P0.

In addition to a floor plan allocating substrate space to each partition, the designer provides a "pin assignment" plan indicating points along the boundaries of each partition at which signal paths conveying the input and output signals of modules included within each partition are to cross. P&R tools can then independently lay out each partition provided that they are able to conform the partition layouts to the floor and pin assignment plans. Such partitioning of the design can often speed up the layout process because it is usually faster for a P&R tool to lay out several partitions of an IC than to lay out the entire IC at once.

As discussed above, an IC employing synchronous logic may include thousands of devices ("syncs") such as registers, latches and flip-flops that are clocked by the same clock signal (CLOCK) supplied as input to the IC. A clock tree synthesis (CTS) tool designs a clock tree as a network of buffers that delivers each edge of the CLOCK signal to all syncs with as little as possible difference (skew) between arrival times at the various syncs.

FIG. 7 illustrates a conventional approach to generating a layout for a partitioned IC design. After creating floor and pin assignment plans establishing the boundaries of each partition and points of interconnection between the partitions (step 70), all partitions are separately laid out in accordance with those plans (step 72). The partition layouts are then assembled into a full-chip layout (step 74) and a clock tree synthesis tool then synthesizes a full-chip clock tree for the entire IC (step 76). When synthesizing a clock tree, the CTS tool specifies only approximate positions of the buffers and the signal paths interconnecting them for purposes of estimating signal path delays within the clock tree. Thus after the CTS tool synthesizes the clock tree, the P&R tool must adjust the layout of every partition to place and route the buffers forming clock tree (step 78).

After completing the layout of an IC, a designer might like to be able to modify the layout of any one partition without affecting the layouts of all of the other partitions. However a conventional clock tree synthesis (CTS) tool cannot modify only the portion of the clock tree serving the changed partition; it has to re-synthesize the clock tree for the entire IC. Thereafter the designer would have to use a P&R tool to adjust the layout of every partition to accommodate the new clock tree. The present invention relates to a method for synthesizing a clock tree in a way that allows a portion of a clock tree serving modules of one partition to be changed without affecting the layout of any other partition except the top level partition.

Figure 8:
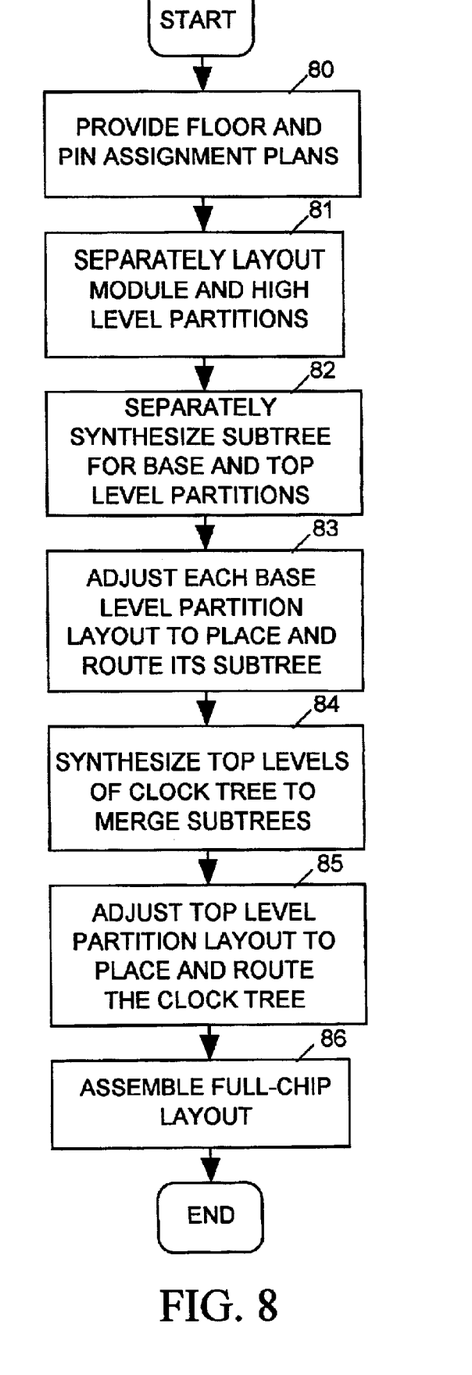
FIG. 8 is a flow chart illustrating an IC layout and clock tree synthesis process in accordance with the present invention.

FIG. 8 illustrates a partitioned IC layout and clock tree process in accordance with the invention. After floor and pin plans are created (step 80), and after a P&R tool separately lays out each partition (step 81) a CTS tool in accordance with the invention separately synthesizes the portion (subtree) of the clock tree that is to serve each partition (step 82).

Figure 9:
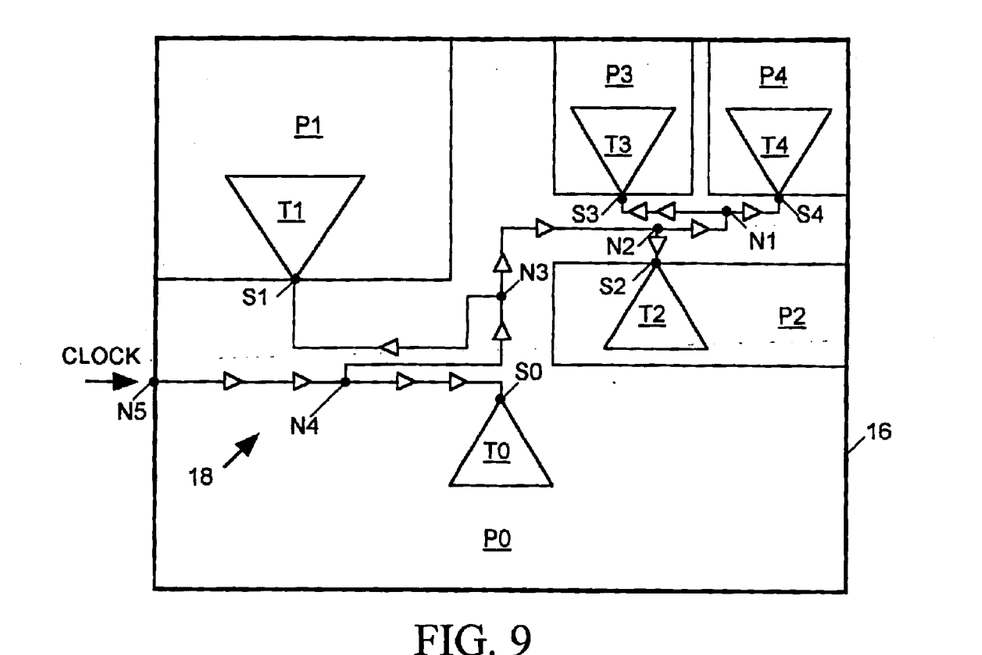
FIG. 9 is a floor plan of an IC layout upon which has been superimposed a symbolic depiction of a clock tree synthesized in accordance with the invention.

FIG. 9 depicts the floor plan of FIG. 2 and uses large triangle to symbolically represent the subtrees T1–T4 synthesized for the four base partitions P1–P4 and the subtree T0 synthesized for the top level partition P0. The CTS tool may use any conventional "zero skew" algorithm to synthesize subtrees T0–T4 at step 82 in a way that minimizes the difference in clock signal path delay between each sync connected to the subtree and the starting point S0–S4 at which the clock signal enters the correspond subtree T0–T4. Conventional zero skew algorithms are capable of balancing each subtree T0–T4 To that the path delay from its start point S0–S4 to any one of the syncs served by subtree T0 varies little from the average path delay D0–D4 to all syncs served by that subtree. Since each subtree T0–T4 is independently synthesized, average path delays D0–D4 for the five subtrees T0–T4 may vary substantially from one another. For example when D3 is substantially greater than D4, it will take substantially longer for a CLOCK signal to travel from point S3 to any sync served by tree T3 than for the CLOCK signal to travel form point S4 to any sync served by tree T4.

After separately synthesizing each subtree at step 82, a P&R tool separately modifies the layout of each base level partition P1–P4 to fix the positions of buffers including in the partition's subtree T1–T4 and to route the signal paths linking the buffers to the subtree start point S1–S4 and to the syncs served by the subtree (step 83). The CTS tool next synthesizes a "top level" of the clock tree which links all of subtrees T0–T4 to an "entry" node N5 at which the CLOCK signal is to enter the IC from an external source. As illustrated in FIG. 9, clock tree top level 18 includes a set of buffered signal paths 18 formed in top level partition P0.

Figure 10:
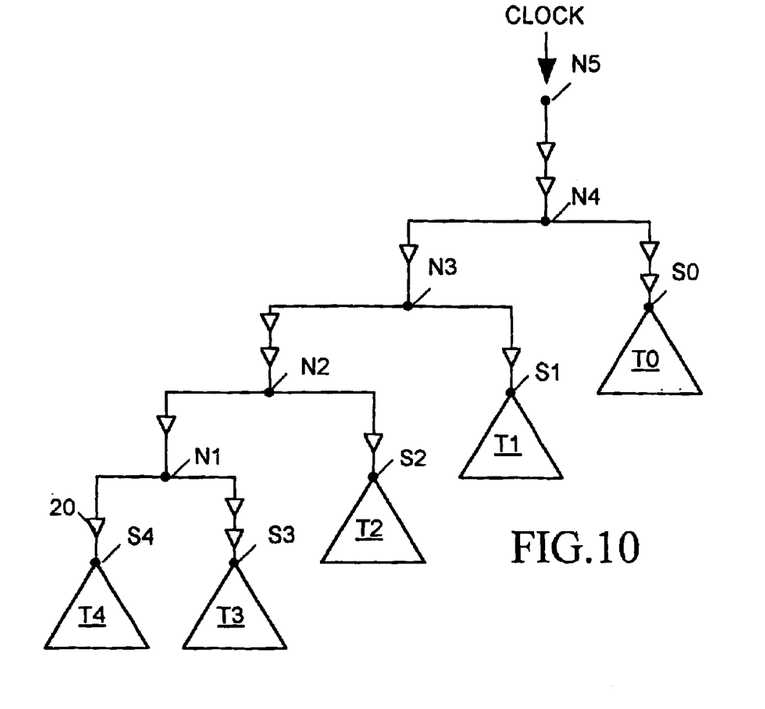
FIG. 10 depicts a clock tree of FIG. 9 in schematic diagram form.

FIG. 10 illustrates in schematic diagram form the clock tree the CTS tool generates for the IC layout of FIG. 9. The CTS tool synthesizes the top level of the clock tree by designing paths 18 to sequentially merge all of the subtrees T0–T4 into the main clock tree, starting with any selected base level subtree T1–T4 and ending with the top level subtree T0.

Referring to FIGS. 9 and 10, the CTS tool first merges subtrees T4 and T3 by linking their starting points through buffered paths to a common node N1. The average CLOCK signal path delay D4 from subtree start point S4 to each sync served by subtree T4 may differ substantially form the average CLOCK signal path delay D3 from subtree start point S3 to each sync served by subtree T3. Therefore the CTS tool designs the paths linking start points S4 and S3 to node N1 so that the average path delay from node N1 to any sync served subtrees T4 substantially matches the average path delay from node N1 to any sync served by subtree T3. When necessary it reduces the path delay between node N1 and either of points S4 or S3 by increasing the number and/or size of buffers 20 in the path. The CTS also adjusts the path delays by adjusting the position of node N1 relative to points S4 and S3. For example to increase the delay between node N1 and point S4 and decrease the delay between node N1 and point S3, the CTS tool can position point N1 closer to point S3 and farther away from point S4.

After having linked subtrees T4 and T3 to node N1, the CTS tool next synthesizes the portion of the clock tree linking node N1 and the start point S2 of subtree T2 to a common node N2. The CTS tool adjusts the size and number of buffers 20 in the path between nodes N2 and N1 and the path between node N2 and point S1 and the position of node N2 so that the average delay from node N2 to all syncs served by subtree T2 as nearly as possible matches the average delay from node N2 to all syncs served by subtrees T3 and T4.

The CTS tool then synthesizes buffered signal paths linking node N2 and the start point S1 of subtree T1 to a common node N3 and paths linking node N3 and the start point of subtree T0 to a common node N4. As it merges each subtree into the main clock tree, the CTS tool designs the interconnecting paths to substantially match the average clock signal path delay to the syncs served by the subtree being merged to the average clock signal path delay to syncs served by all previously merged subtrees. The CTS tool completes the synthesis of the top level of the clock tree by providing a buffered path linking node N4 to the node N5 at which the CLOCK signal arrives on substrate 16 via a bond wire or other type of external connection.

After the CTS tool has synthesized the top levels of the clock tree at step 84 (FIG. 8), a P&R tool adjusts the layout of top level partition P0 to detail the placement and routing of the top levels of the clock tree (step 85). The layouts of all partitions may then be assembled to produce a full-chip layout (step 86).

Note that in the prior art process illustrated in FIG. 7 partition layouts are assembled into a full-chip layout at step 74 before clock tree synthesis begins at step 76. In the layout process of the present invention, depicted in FIG. 8, clock tree synthesis is separately carried out on each base and top level partition at steps 82 and 84 before the partitions are assembled into a full-chip layout. Thus the CTS tool is able to independently synthesize subtrees for all partitions P0–P4.

One advantage to the new process illustrated in FIG. 8 over the prior art process of FIG. 7 becomes apparent when the designer wants to change the layout of any partition of an IC design for which placement and routing has already been completed. As discussed above, when a conventional full-chip CTS tool is used to synthesize the clock tree for the entire IC, a change to the layout of any partition P0–P4 requires the CTS to re-synthesize the entire clock tree, thereby requiring the designer to adjust the layout of every partition. When the clock tree has been synthesized in accordance with the invention, then it is possible to change to the layout of any partition P0–P4 without requiring a change to the clock tree subtree serving any other partition. For example if the designer were to modify the layout of partition P3 of FIG. 9, it would be necessary for the CTS tool to re-synthesize only the subtree T3 for that partition and (if the path delay for the revised subtree T3 changes) to the top level portions of the clock tree formed in partition P0. However the CTS tool would not have to make any changes to the subtrees T0–T2 or T4 serving any other base level partition. Thus a change in the layout of partition P3 of FIG. 9 typically requires only relatively small changes in the layout of top level partition P0 as necessary to accommodate any needed adjustments to the top level the clock tree. Layouts of all other base level partitions remain unchanged.

In some applications it will not be necessary to synthesize a subtree for every partition as illustrated in FIGS. 9 and 10 because some partitions may not include any syncs. Thus for example in an application where all modules and cells are assigned to base level partitions, it would not be necessary to synthesize a subtree for the top level partition. In such case the top level partition would include buffer signal paths only for routing input/output signals between the various base level partitions and for routing the CLOCK signal from its entry point to those base level partitions that do include syncs.

The forgoing specification and the drawings depict a best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps depicted in the specification and drawings. Accordingly should any appended claim describe an element or step only in terms of its function, then it is intended that the claim's description of the element be interpreted as reading on any element or step having the described function, regardless of any structural limitations associated with any example of such element or step depicted in this specification or in the drawings.

What is claimed is:

1. Computer-readable media containing a program which, when read and executed by a computer, causes the computer to synthesize a clock tree for a partitioned integrated circuit (IC) layout comprising a plurality of base level partitions and a top level partition each occupying a separate area of a semiconductor substrate, wherein the base level partitions comprise syncs to be clocked by edges of a clock signal applied to an entry node within the area occupied by the top level partition, the computer-readable media comprising:

first computer instructions for causing the computer to separately synthesize a plurality of independently balanced subtrees, each subtree corresponding to a separate base level partition and comprising a start point at a perimeter of the area occupied by that base level partition and a network of buffers and signal paths for conveying a clock signal edge from the start point to each sync included within that area; and second computer instructions for causing the computer to synthesize a top level portion of the clock tree for conveying the clock signal from the entry point to the start point of each synthesized subtree.

2. The computer readable media in accordance with claim 1 wherein each subtree has an average clock signal path delay that is an average of clock signal path delays between the subtree's start point and all syncs within the corresponding base level partition, wherein at least two of the subtrees have substantially dissimilar average clock signal path delays, and wherein path delays of paths within the top level portion of the clock tree linking the entry node to the start point of each subtree compensate for differences in average path delays of the subtrees so as to substantially equalize clock signal path delays between the entry point and all syncs.

3. The computer-readable media in accordance with claim 1 wherein the top level partition also includes syncs, the computer-readable media further comprising:

instructions for causing the computer to synthesize a balanced subtree of the clock tree for the top level partition for delivering the clock signal from a start point within the area of the substrate occupied by the top level partition to each sync included within the top level partition, wherein the synthesized top level portico of the clock tree also conveys the clock signal from the entry point to the start point of the synthesized subtree for the top level partition.

4. The computer-readable media in accordance with claim 1 wherein the subtrees have substantially differing average clock signal path delays, each subtree's average clock signal path delay being defined as an average of clock signal path delays between that subtree's starting point and all syncs within the corresponding base level partition, and wherein the second computer instructions comprises:

computer instructions for causing the computer to select a first bass level partition and a second base level partition from among the plurality of base level partitions, computer instructions for causing the computer to synthesize a first signal path linking the start point of the subtree of first base level partition to a first node within the top level partition, and computer instructions for causing the computer to synthesize a second signal path linking the start point of the subtree of the second base level partition to the first node, wherein the first and second signal paths provide substantially differing path delays between the first node and the start points of the subtrees of the first and second partitions to compensate for the substantially differing average clock signal path delay of the subtrees of the first and second base level partitions so that a clock signal edge departing the first node will arrive at each sync within the first and second base level partitions at substantially the same time.

5. The computer-readable media in accordance with claim 4 wherein the second instructions cause the computer to adjust path delays of the first and second signal paths to compensate for the substantially differing clock signal path delays of the subtrees of the first and second partitions by adjusting at least one of the following:

a number of buffer; included in the paths, a size of at least one buffer included in the path, a position of at least one buffer included in the path, and a position of the selected nods relative to the start points of the first and second trees.

6. The computer-readable media in accordance with claim 4 wherein the second instructions cause the computer to adjust path delays of the first and second signal paths to compensate for the substantially differing clock signal path delays of the subtrees of the first and second base level partitions by adjusting all of the following:

a number of buffers included in the path, a size of at leant one buffer included in the paths, a position of at least one buffer included in the paths, and a position of the selected node relative to the start points of the subtrees of the first and second base level partitions.

7. The computer-readable media in accordance with claim 6 wherein the second instructions further comprise:

computer instructions for causing the computer to select a third base level partition from among the plurality of base level partitions, computer instructions for causing the computer to synthesize a third signal path linking the first node to a second node within the top level partition, and computer instructions for causing the computer to synthesize a fourth signal path linking the subtree of the third base level partition to the second node, wherein the third and fourth signal paths provide substantially differing path delays to compensate for substantially differing average clock signal path delays of the subtrees of the first, second and third partitions so that a clock signal edge departing the second node will arrive at each sync within the first, second and third partitions at substantially the same time.

8. The computer-readable media in accordance with claim 7 wherein the second instructions cause the computer to adjust path delays of the third and fourth signal paths to compensate for the substantially differing clock signal path delays of the subtrees of the first and second partitions by adjusting at least one of the following:

a number of buffers included in the paths, a size of at least one buffer included in the path, a position of at least one buffer included in the path, and a position of the selected node relative to the start points of the first and second trees.

9. A method for synthesizing a clock tree for a partitioned integrated circuit (IC) layout comprising a plurality of base level partitions and a top level partition each occupying a separate area of a semiconductor substrate, wherein the base level partitions comprise syncs to be clocked by edges of a clock signal applied to an entry node within the area occupied by the top level partition, the method comprising the steps of:

a. separately synthesizing a plurality of independently balanced subtrees, each subtree corresponding to a separate base level, partition and comprising a start point at a perimeter of the area occupied by that base level partition, and a network of buffers and signal paths for conveying a clock signal edge from the start point to each sync included within that area; and b. synthesizing a top level portion of the clock tree for conveying the clock signal from the entry point to the start point of each synthesized subtree.

10. The method in accordance with claim 9 wherein each subtree has an average clock signal path delay that is an average of clock signal path delays between the subtree's start point and all syncs within the corresponding base level partition, wherein at least two of the subtrees have substantially dissimilar average clock signal path delays, and wherein path delays of paths within the top level portion of the clock tree linking the entry node to the start point of each subtree compensate for differences in average path delays of the subtrees so as to substantially equalize clock signal path delays between the entry point and all syncs.

11. The method in accordance with claim 9 wherein the top level partition also includes syncs, the method further comprising the step of:

c. synthesizing a balanced subtree of the clock tree for the top level partition for delivering the clock signal from a start point within the area of the substrate occupied by the top level partition to each sync included within the top level partition, wherein the synthesized top level portion of the clock tree also conveys the clock signal from the entry point to the start point of the synthesized subtree for the top level partition.

12. The method in accordance with claim 9 wherein the synthesized subtrees have substantially differing average clock signal path delays, each subtree's average clock signal path delay being defined as an average of clock signal path delays between that subtree's starting point and all syncs within the corresponding base level partition, and wherein step b comprises the substeps of:

b1. selecting a first base level partition and a second base level partition from among the plurality of base level partitions, b2. synthesizing a first signal path linking the start point of the subtree of first base level partition to a first node within the top level partition, and b3. synthesizing a second signal path linking the start point or the subtree of the second base level partition to the first node, wherein the first end second signal paths provide substantially differing path delays between the first node and the start points of the subtrees of the first and second partitions to compensate for the substantially differing average clock signal path delay of the subtrees of the first and second base level partitions so that a clock signal edge departing the first node will arrive at each sync within the first and second base level partitions at substantially the same time.

13. The method in accordance with claim 12 wherein the path delay. of the first and second signal paths are adjusted at steps b2 and b3 to compensate for the substantially differing clock signal path delays of the subtrees of the first and second partitions by adjusting at least one of the following:

a number of buffers included in the paths, a size of at least one buffer included in the path, a position of at least one buffer included in the path, and a position of the selected node relative to the start points of the first and second trees.

14. The method in accordance with claim 12 wherein the path delays of the first and second signal paths are adjusted at steps b2 and b3 to compensate for the substantially differing clock signal path delays of the subtrees of the first and second base level partitions by adjusting all of the following:

a number of buffers included in the paths, a size of at least one buffer included in the paths, a position of at least one buffer included in the paths, and a position of the selected node relative to the start points of the subtrees of the first and second base level partitions.

15. The method in accordance with claim 12 wherein step b further comprises the substeps of:

b4. selecting a third base level partition from among the plurality of base level partitions, b5. synthesizing a third signal path linking the first node to a second node within the top level partition, and b6. synthesizing a fourth signal path linking the subtree of the third base level partition to the second node, wherein the third and fourth signal paths provide substantially differing path delays to compensate for substantially differing average clock signal path delays of the subtrees of the first, second and third partitions so that a clock signal edge departing the second node will, arrive at each sync within the first, second and third partitions at substantially the same time.

* * * * *

UNITED STATES PATENT AND TRADEMARK OFFICE
CERTIFICATE OF CORRECTION

PATENT NO.    : 6,751,786 B2
DATED         : June 15, 2004
INVENTOR(S)   : Chin-Chi Teng and Wei-Jin Dai It is certified that error appears in the above-identified patent and that said Letters Patent is hereby corrected as shown below:

Column 10,
Line 38, "nods" should be deleted and replaced with -- node --.

Column 12,
Line 23, "delay." should be deleted and replaced with -- delays --.

Signed and Sealed this

Twenty-third Day of November, 2004

JON W. DUDAS
*Director of the United States Patent and Trademark Office*